United States Patent
Pious et al.

(10) Patent No.: US 9,208,902 B2
(45) Date of Patent: Dec. 8, 2015

(54) BITLINE LEAKAGE DETECTION IN MEMORIES

(75) Inventors: Beena Pious, Carrollton, TX (US); Xiaowei Deng, Plano, TX (US); Wah Kit Loh, Richardson, TX (US); Jon Lescrenier, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 234 days.

(21) Appl. No.: 12/608,101

(22) Filed: Oct. 29, 2009

(65) Prior Publication Data

US 2010/0110807 A1  May 6, 2010

Related U.S. Application Data

(60) Provisional application No. 61/110,446, filed on Oct. 31, 2008.

(51) Int. Cl.
| G11C 29/00 | (2006.01) |
| G11C 29/12 | (2006.01) |
| G11C 29/02 | (2006.01) |
| G11C 11/22 | (2006.01) |
| G11C 11/41 | (2006.01) |
| G11C 29/50 | (2006.01) |

(52) U.S. Cl.
CPC .............. *G11C 29/842* (2013.01); *G11C 29/02* (2013.01); *G11C 29/025* (2013.01); *G11C 29/12* (2013.01); *G11C 11/22* (2013.01); *G11C 11/41* (2013.01); *G11C 2029/1204* (2013.01); *G11C 2029/5006* (2013.01)

(58) Field of Classification Search
USPC ...... 365/194 O, 201 X, 203 X, 194, 201, 203
See application file for complete search history.

(56) References Cited

U.S. PATENT DOCUMENTS

| 5,818,770 | A | * | 10/1998 | Kim et al. ..................... 365/194 |
| 6,434,065 | B1 | * | 8/2002 | Kobayashi et al. ............ 365/200 |
| 6,741,518 | B2 | * | 5/2004 | Kojima et al. ........... 365/230.06 |
| 7,319,607 | B2 | * | 1/2008 | Sakuma ........................ 365/145 |
| 7,321,517 | B2 | * | 1/2008 | Ikeda et al. ................... 365/194 |
| 7,471,579 | B2 | * | 12/2008 | Uchikoba et al. ............. 365/201 |
| 2007/0153599 | A1 | * | 7/2007 | Joshi et al. .................... 365/201 |
| 2007/0183234 | A1 | * | 8/2007 | Han et al. ...................... 365/203 |
| 2008/0117709 | A1 | * | 5/2008 | Adams et al. ............ 365/230.06 |
| 2008/0186784 | A1 | * | 8/2008 | Eby et al. ...................... 365/201 |

* cited by examiner

*Primary Examiner* — Vanthu Nguyen
(74) *Attorney, Agent, or Firm* — Rose Alyssa Keagy; Frank D. Cimino

(57) ABSTRACT

An integrated circuit containing a memory and a sense amplifier. The integrated circuit also containing an extended delay circuit which extends the delay between when a precharged bitline is floated and when a wordline is enabled. A method of testing an integrated circuit to identify bitlines with excessive leakage.

12 Claims, 8 Drawing Sheets

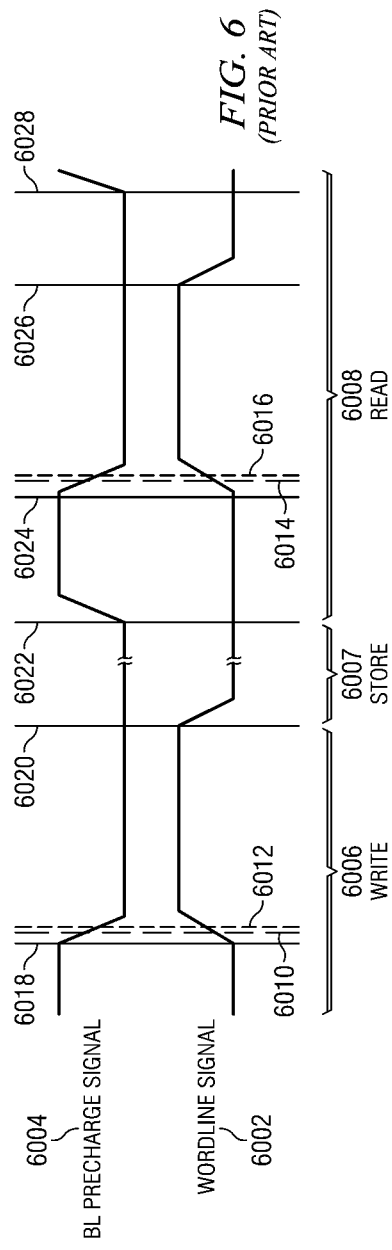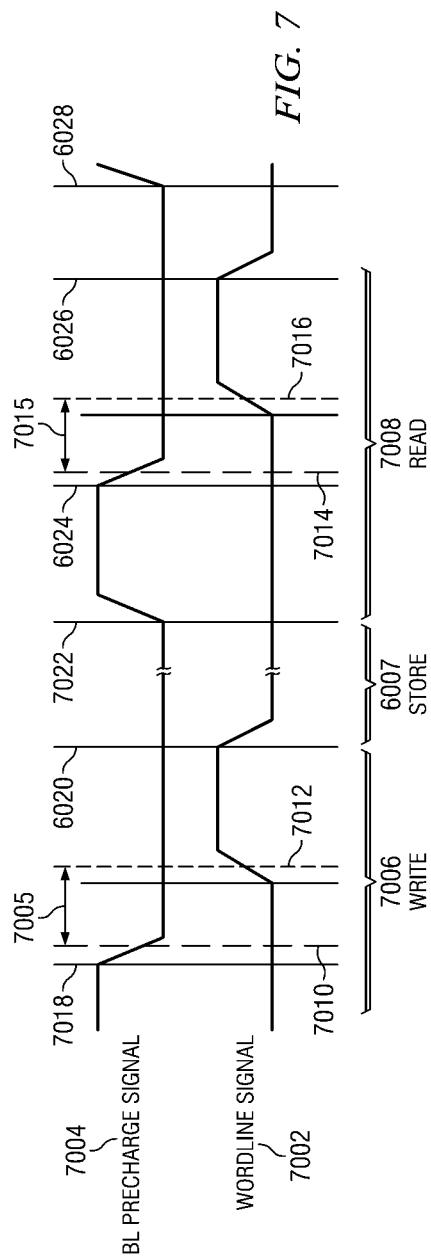

US 9,208,902 B2

BITLINE LEAKAGE DETECTION IN MEMORIES

FIELD OF THE INVENTION

This invention relates to the field of integrated circuits. More particularly, this invention relates to the testing of integrated circuits.

DESCRIPTION OF THE VIEWS OF THE DRAWING

FIG. 6 (Prior Art) is an example timing diagram of bitline precharge and wordline enable signals.

FIG. 7 is an example timing diagram of bitline precharge and wordline enable signals in accordance with an embodiment.

DETAILED DESCRIPTION

Figure 1:
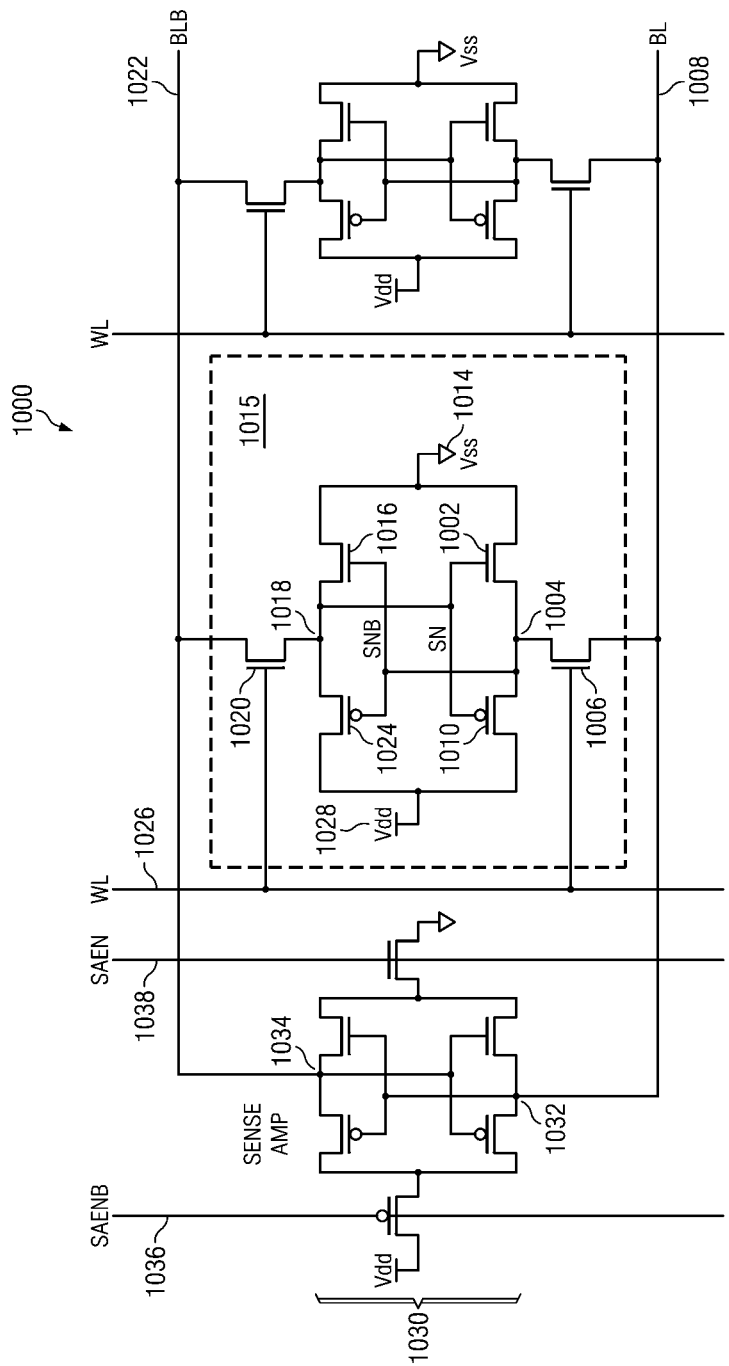
FIG. 1 (Prior Art) is an example SRAM memory cell sensing scheme.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments are illustrated in detail with an SRAM memory array, but other memory arrays which use sense amplifiers to read the logic states, such as FLASH, EPROMS, EEPROMS, and ferroelectric memories (FRAMS), may also be used.

The logic state of a 6-T SRAM cell in an integrated circuit is typically read using a sense amplifier (1030). As shown in FIG. 1, an example integrated circuit (1000) contains an SRAM cell (1015) having two bitlines, called bitline, BL, (1008) and bitline-bar, BLB, (1022). Bitline (1008) is connected to one input (1032) of the sense amplifier (1030) and is also connected to one of the storage nodes, SN, (1004) of the SRAM cell through a first pass transistor (1006). Bitline-bar (1022) is connected to the other input (1034) of the sense amplifier (1030) and is also connected to the other storage node, SNB, (1018) of the SRAM cell through a second pass transistor (1020). SN (1004) is connected through pulldown transistor (1002) to Vss (1014) which is approximately ground, and through pullup transistor (1010) to Vdd (1028). SNB (1018) is connected through pulldown transistor (1016) to Vss (1014) and through pullup transistor (1024) to Vdd (1028). To store a logic state, a high voltage, approximately Vdd (1028), is stored on one of the storage nodes, SN (1004) for example, and a low voltage, approximately Vss (1014), is stored on the other storage node, SNB (1018). As shown in FIG. 1, SN (1004) is connected to the gate of the inverter formed by pullup transistor (1024) and pulldown transistor (1016). Likewise, SNB (1018) is connected to the gate of the inverter formed by pullup transistor (1010) and pulldown transistor (1002). A high voltage on SN (1004) turns PMOS pullup transistor (1024) off and pulldown transistor (1016) on to maintain the low voltage on SNB (1018). Likewise, a low voltage on SNB (1018) turns pulldown transistor (1002) off and pullup transistor (1010) on to maintain the high voltage on SN (1004). A signal may enable wordline, WL, (1026) and turn on pass transistors (1006) and (1020) connecting BL (1008) to SN (1004) and BLB (1022) to (SNB (1018) respectively. Sense amplifier (1030) may be enabled by signals applied to sense amplifier enable (1038), SAEN, and sense amplifier enable bar (1036), SAENB.

An example timing diagram showing the bitline precharge signal and the wordline enable signal during a normal read of an SRAM cell is given in FIG. 6. At the beginning of the read (6008) operation, step (6022), the BL precharge (6004) signal is enabled (goes high) to precharge BL (1008) and BLB (1022) to Vdd (1028). At step (6024) BL precharge (6004) is disabled (6014) causing BL (1008) and BLB (1022) to float (to be disconnected from the power supply). At approximately the same time, the wordline signal (6002) goes high (6016) turning passgate transistors, (1006) and (1020), on. This connects BL (1008) through pass transistor (1006) to SN (1004), and also connects BLB (1022) through pass transistor (1020) to SNB (1018). For illustrative purposes, the voltage on SN (1004) is chosen to be approximately Vdd (1028) and the voltage on SNB (1018) is chosen to be approximately Vss (1014). The high voltage on SN (1004) turns pulldown transistor (1016) on, connecting BLB (1022) to Vss (1014) through pass transistor (1020) and pulldown transistor (1016), thereby causing it to discharge. The low voltage, on SNB (1018) turns pulldown transistor (1002) off and pullup transistor (1010) on, connecting BL (1008) to Vdd (1028) through pass transistor (1006) and pullup transistor (1010), thereby maintaining the high voltage on BL (1008). This occurs during the interval between steps (6024) and (6026) in the timing diagram when BL precharge (6004) is disabled (6014) and the WL signal (6002) is enabled (6016). At step (6026) in the timing diagram, the WL signal (6002) is disabled and the differential voltage between BL (1008) (which is near Vdd) and BLB (1022) (which is at a discharged low level, such as 100 mV below Vdd), appears across the inputs, (1032) and (1034), of the sense amplifier (1030). During the interval between step (6026) and step (6028) the sense amplifier (1030) is activated with signals sent to SAEN (1038) and SAENB (1036) and the logic state of the SRAM cell (1000) is read.

SRAM bitline structures include a significant amount of diode area in addition to contacts, vias, and interconnect. Bitline leakage during the time that the bitlines are floated may cause the charge on the bitline to leak off, thereby lowering the bitline voltage. In some cases, the bitline leakage may be excessive—causing the bitline voltage to fall and forming a reduced differential voltage across the inputs to the sense amplifier. When this happens, a read error may occur.

To illustrate an SRAM write operation, a logic state "1" (in which a high voltage is stored on SN (1004) and a low voltage is stored on SNB (1018)) is over written with a logic state "0" (in which a low voltage is written into SN (1004) and a high voltage is written into SNB (1018)). A timing diagram showing the BL precharge signal (6004) and the WL signal (6002) during an SRAM write operation (6006) is given in FIG. 6. Prior to step (6018) the BL precharge is enabled to precharge BLB (1022) to a high voltage near Vdd (1028) and to precharge BL (1008) to a low voltage near Vss (1014). At step (6018) the BL precharge is disabled (6010) causing BL (1008) and BLB (1022) to float. At the same time, the write circuit is enabled to drive BL (1008) to a low voltage near Vss (1014). Also at nearly the same time the wordline signal (6002) is enabled (6012) to turn passgate transistors, (1006) and (1020), on. During the interval between (6018) and (6020) the high voltage on BLB (1022) pulls SNB (1018) up, thereby raising the voltage on gates of the inverter formed by pullup transistor (1010) and the pulldown transistor (1002). Likewise, the low voltage on BL (1008) discharges SN (1004), thereby decreasing the voltage on the gates of the inverter formed by pullup transistor (1024) and pulldown transistor (1016). When the voltage on SN (1004) is sufficiently reduced and the voltage on SNB (1018) is sufficiently raised then a trip point of the SRAM cell is reached (where the pullup transistor (1010) switches from on to off and the pulldown transistor (1002) switches from off to on), thereby causing SN to discharge to near Vss (1014). Similarly at the trip point in the other inverter (where the pulldown transistor (1016) switches from on to off and the pullup transistor (1024) switches from off to on), SNB (1018) is charged to near Vdd (1028). At step (6020), the signal (6002) is then removed from the WL (1026), thereby turning pass transistors (1006) and (1020) off and completing the write of logic state "0" into the SRAM cell. The new logic state is stored (6007) in the SRAM cell during the interval between (6020) and the start of a read operation at (6022).

As in the case of the read operation, bitline leakage may cause an error in the write operation. In the above example, if there is excessive bitline leakage on the precharged BLB after it is floated, then charge loss may cause the voltage on BLB (1022) to drop to a point where it no longer is able to raise the voltage on SNB (1018) sufficiently for the SRAM cell (1015) to reach the trip point. When this happens, a write error may occur.

Silicide pipes that may be formed within the transistors of the SRAM cell (1015) during the nickel silicide process are a common source of bitline leakage in SRAM arrays. For example, nickel may diffuse along crystal defects, thereby causing leakage paths from the junctions to the substrate, or from the transistor source to the transistor drain. Other sources of excessive bitline leakage may include contact-to-gate shorts, crystal defects, gate-to-junction shorts, and short channel effects.

Integrated circuits typically undergo burn-in testing for extended periods of time to identify and discard chips with excessive bitline leakage. However, burn-in testing adds considerable cost to the integrated circuit chip. It is therefore of interest to be able to detect excessive bitline leakage during the final test and thereby possibly avoid burn-in testing.

The term "normal read" and "normal write" refers to the reading and writing of the logic state in a memory cell using the normal read and write conditions when the integrated circuit operates throughout its lifetime in a product. The delay between floating a precharged bitline and the wordline enable during normal read and normal write may be less than 1 ns.

The term "write extended delay" refers to the delay between when precharged bitlines are floated and when the wordline is enabled to complete a write operation. This extended delay may be in the range of 5 ns to 60 ns. The term "read extended delay" refers to the delay between when precharged bitlines are floated and when the wordline is enabled to complete a read operation. This extended delay may also be in the range of 5 ns to 60 ns.

Figure 2:
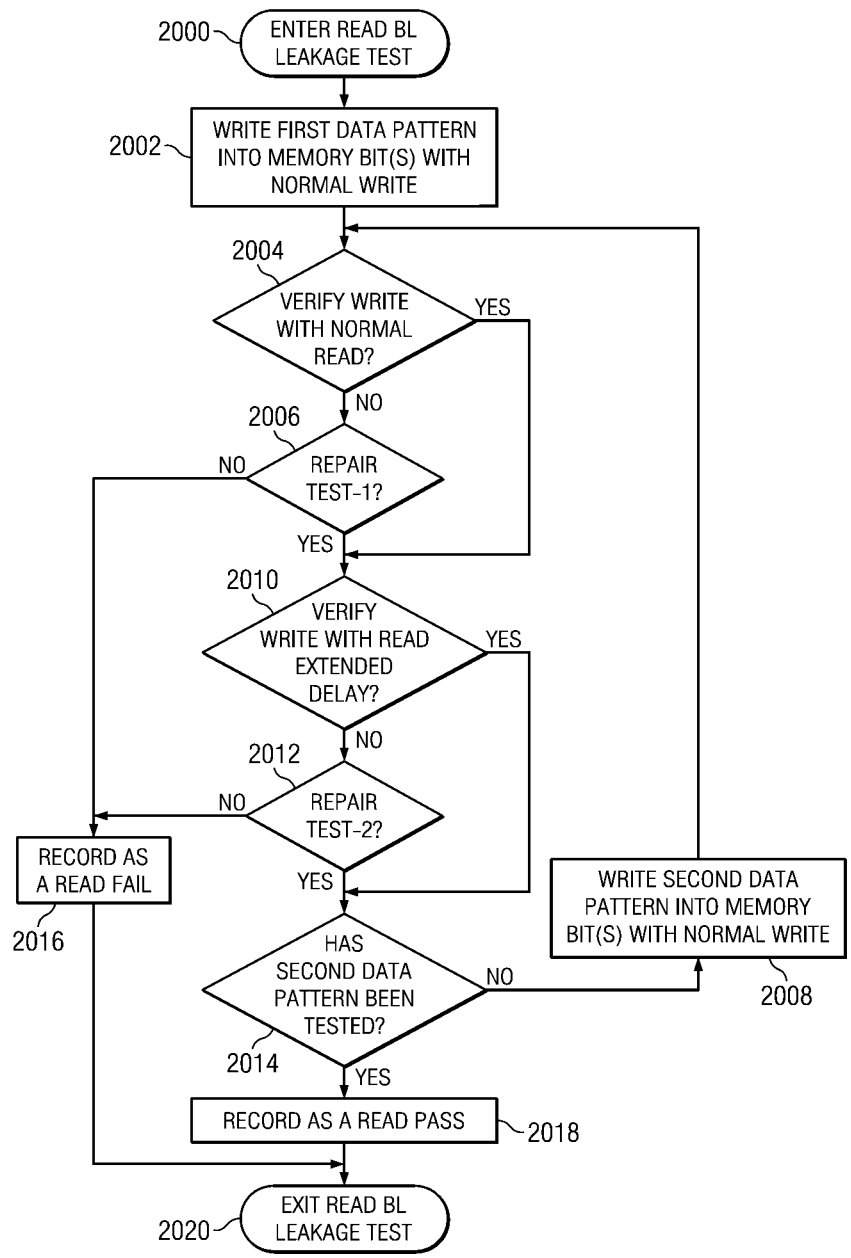
FIG. 2 is a flow diagram of a read bitline leakage test in accordance with an embodiment.

FIG. 2 is a flow diagram of an electrical test according to an embodiment that may be used at final test to identify integrated circuits with excessive bitline leakage. The read BL leakage test begins with step (2000) when a signal is sent to the integrated circuit to switch it into the read BL leakage test mode. A data pattern is written into the memory bits in step (2002) using a normal write and the pattern is verified by performing a normal read (2004). If an error is detected (e.g. the read data (2004) does not match the written data (2002)) then the test advances to step (2006) where a decision is made whether or not the defective memory bit may be repaired. If it cannot then a failure is recorded (2016) and the test is terminated (2020). If the memory bit may be repaired then the test proceeds to step (2010), which is the same step the test proceeds to if no data errors are detected at step (2004). In step (2010), the data is again read but this time with an extended delay between when the precharged bitlines are floated and when the wordline is enabled.

A timing diagram which illustrates this sequence is shown in FIG. 7. BL precharge (7004) is enabled at the beginning step (7022) of read operation (7008) to precharge BL (1008) and BLB (1022) to Vdd (1028). BL precharge (7004) is then disabled (7014) and after a delay the wordline signal (7002) enabled (7016) to turn passgate transistors, (1006) and (1020), on. The delay between (7014) and (7016) in FIG. 7 may be between 5 ns and 60 ns, whereas the delay between (6014) and (6016) in a normal read operation (6008) in FIG. 6 may be less than 1 ns. During this read extended delay (7015), a bitline with excessive leakage may discharge sufficiently to cause a read error (that is detected by the read BL leakage test described in FIG. 2). If an error is detected during step (2010) the test proceeds to step (2012) to determine if repair is possible by replacing the leaky bitline with a redundant column. If it cannot be repaired then a fail is recorded (2016) and the test is terminated (2020). If it may be repaired then the test proceeds to step (2014) to determine if both the $1^{st}$ data pattern and the $2^{nd}$ data pattern (which typically is the inverse of the $1^{st}$ data pattern) have been tested. If not then the test proceeds to step (2008) to repeat the read BL leakage test on the $2^{nd}$ data pattern. If the $2^{nd}$ data pattern has been tested, a pass is recorded in step (2018) and the test is exited (2020).

Figure 3:
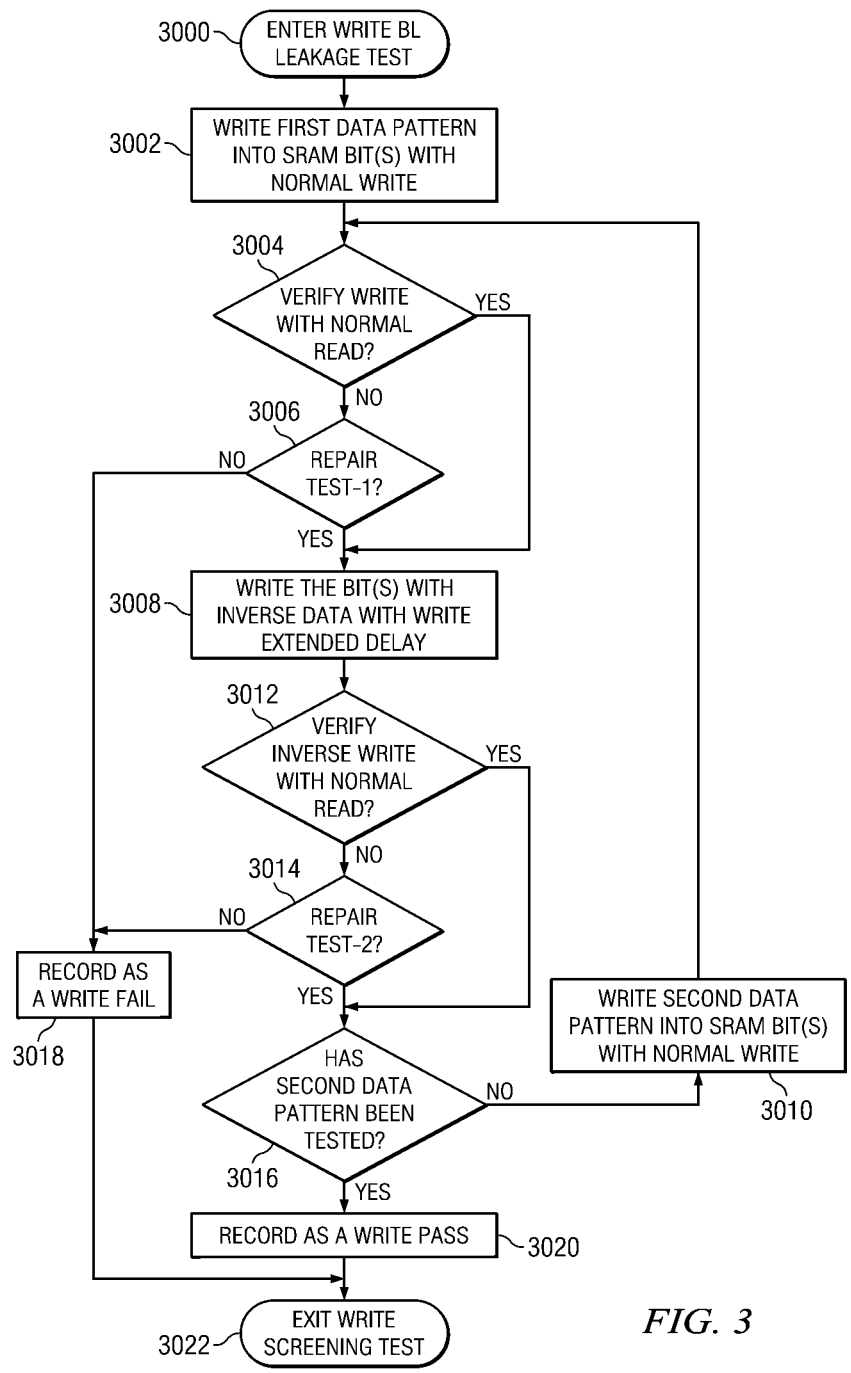
FIG. 3 is a flow diagram of a write bitline leakage test in accordance with an embodiment.

A flow diagram of an electrical test that may be performed to detect excessive bitline leakage during a write operation at final test according to another embodiment is shown in FIG. 3. The SRAM write BL leakage test begins with step (3000) when a signal is sent to the integrated circuit to switch it into the test mode. A data pattern is written into the SRAM bits in step (3002) using a normal write and then the pattern is verified by performing a normal read (3004). If an error is detected (e.g. the read data (3004) does not match the written data (3002)), the test advances to step (3006) where a decision is made regarding whether or not the defective SRAM bit may be repaired. If it cannot be repaired then a failure is recorded (3018) and the test is terminated (3022). If however the SRAM bit may be repaired then the test proceeds to step (3008), which is the same step the test proceeds to if no data errors are detected at step (3004). In step (3008) an inverse of the first data pattern is written into the SRAM bits with an extended delay between when the precharged bitlines are floated and when the wordline is enabled to write the bit. The extended delay may be in the range of 5 ns to 60 ns.

A timing diagram which illustrates the extended write delay is shown in FIG. 7. At the start of the write operation (7006), the wordline enable signal (7002) is low so that the passgate transistors are turned off and the BL precharge signal (7004) is high so that the bitlines, BL (1008) and BLB (1022) are precharged to Vdd (1028). At the end of the precharge step (7018) the BL precharge signal (7004) is turned off (7010) causing BL (1008) and BLB (1022) to float. BLB (1022) is then driven to Vss (1014) by the write circuitry (not shown). After an extended delay which may be between 5 ns and 60 ns the WL signal (7002) is enabled (7012) to turn passgate transistors, (1006) and (1020), on. During this write extended delay (7005), a bitline with excessive leakage may be discharged sufficiently to cause a write error (that is detected by the write BL leakage test described in FIG. 3). If an error is detected during step (3012), the test proceeds to step (3014) to determine if the leaky bitline may be repaired by replacement with a redundant column. If it cannot, then a fail is recorded (3018) and the test is terminated (3022). If it may be repaired, then the test proceeds to step (3016) to determine if both the 1$^{st}$ data pattern and the 2$^{nd}$ data pattern (which typically is the inverse of the 1$^{st}$ data pattern written into the memory in step (3002)) have been tested. If not, then the test proceeds to step (3010) to repeat the write BL leakage test with the 2$^{nd}$ data pattern. If the 2$^{nd}$ data pattern has been tested, then a pass is recorded in step (3020) and the test is exited (3022).

Figure 4:
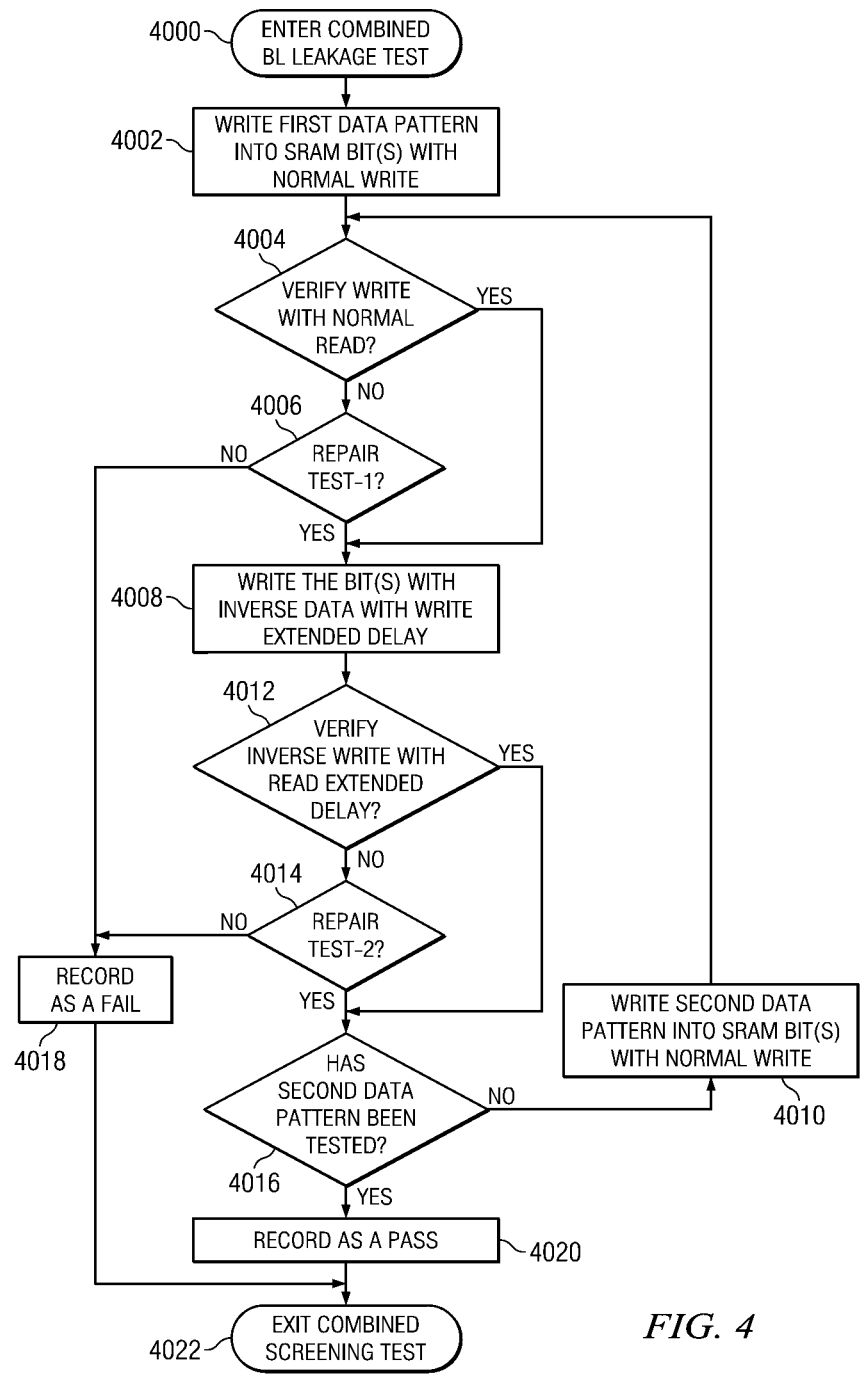
FIG. 4 is a flow diagram of a combined bitline leakage test in accordance with an embodiment.

As shown in FIG. 4, in an additional embodiment, the SRAM write BL leakage test and the SRAM read BL leakage test may be combined into one integrated test that may save time at final test. The first step in the combined BL leakage test is to write a first data pattern into the SRAM bits (4002) using a normal write and then to verify the write was successful using a normal read (4004). If a data error is found, the test proceeds to step (4006) to determine if the bit may be repaired. If repair is not possible a failure is recorded (4018) and the test is terminated (4022). If repair is possible, the test then proceeds to step (4008) which is the same step the test proceeds to if no data errors are found in step (4004). In step (4008) the inverse of the first data pattern is written into the SRAM bits (4008) using a write extended delay (7005). The data is then read in step (4012) with a read extended delay (7015). If a data error that may have occurred during the extended delay write step (4008) or during the extended delay read step (4012) is detected, then the test proceeds to step (4014) where it is determined whether a repair may be accomplished by replacing the leaky bitlines with redundant columns. If they cannot, then the test records a failure (4018) and the test is terminated (4022). If, however, the repair may be accomplished, the test proceeds to step (4016) which is the same step the test proceeds to if no data errors are detected in step (4012). Step (4016) checks to see if both the first data pattern and a second data pattern (which typically is the inverse of the data pattern written into the memory in step 4002) have been tested. If the second data pattern has not been tested, the test proceeds to step (4010) in which the second data pattern is written into the SRAM bits using a normal write prior to retesting. If, however, the second data pattern has been tested, a pass is recorded (4020) and the test is exited (4022).

Figure 5:
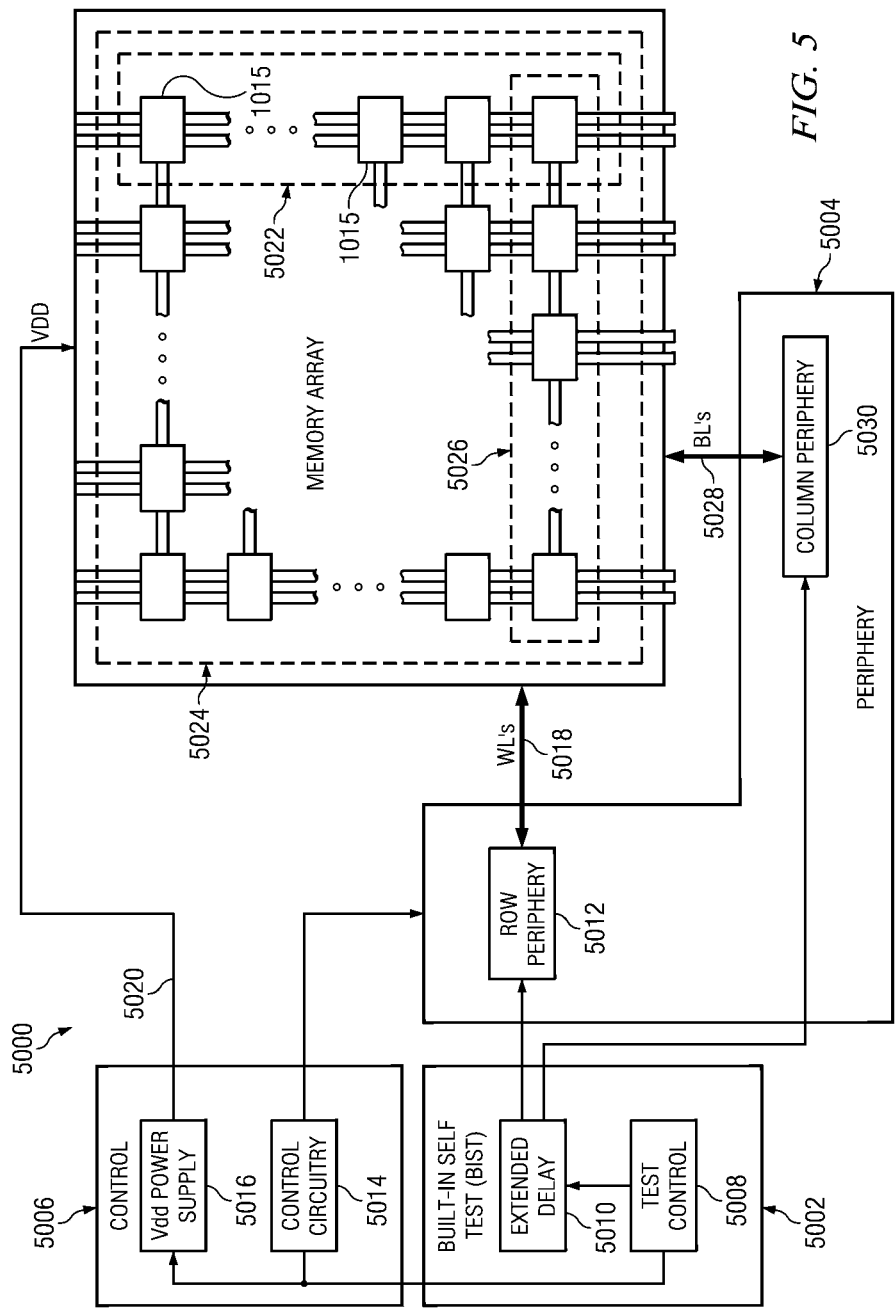
FIG. 5 is an integrated circuit with an extended bitline precharge disable to wordline enable delay circuit in accordance with an embodiment.

An integrated circuit (5000) with an extended delay circuit (5010) according to an embodiment is shown in FIG. 5. The integrated circuit (5000) contains a memory array (5024), memory periphery circuit (5004), control circuit (5006), and built in self test circuit (5002), BIST. The memory array (5024) contains memory cells (1015) arranged in columns (5022) which are connected by bitlines (5028) to the column periphery (5030) and arranged in rows (5026) which are connected by wordlines (5018) to the row periphery (5012). During normal operation the control circuitry (5014) sends signals to the power supply (5016) and to the memory periphery circuit (5004) to write and read data from the selected memory bits. During the testing of the memory array a signal from an external pin (not shown) switches the integrated circuit (5000) into the testing mode. Test control circuit (5008) sends signals to the control circuitry (5014), the memory periphery circuit (5004), and the extended delay circuit (5010) to perform functional tests and to also perform the BL leakage tests according to the embodiments described above.

The BL leakage tests described above may be performed with the extended delay signals generated on chip. Alternatively, the BL leakage tests may be performed using extended delay signals generated off chip. In the example embodiments, the extended delay signals are generated on chip. Furthermore, the BL leakage tests according to the embodiments described above may be performed during final test to identify integrated circuits with excessive bitline leakage. Finding defective integrated circuits at final test may eliminate the need for burn-in and thereby may avoid the wasted cost of performing burn-in on defective integrated circuits. Moreover, though the example embodiments have been illustrated using an SRAM memory array, other memory arrays such as FLASH, EPROM, and FRAM memory arrays would also benefit when a sense amplifier is used to read the logic state.

Figure 8:
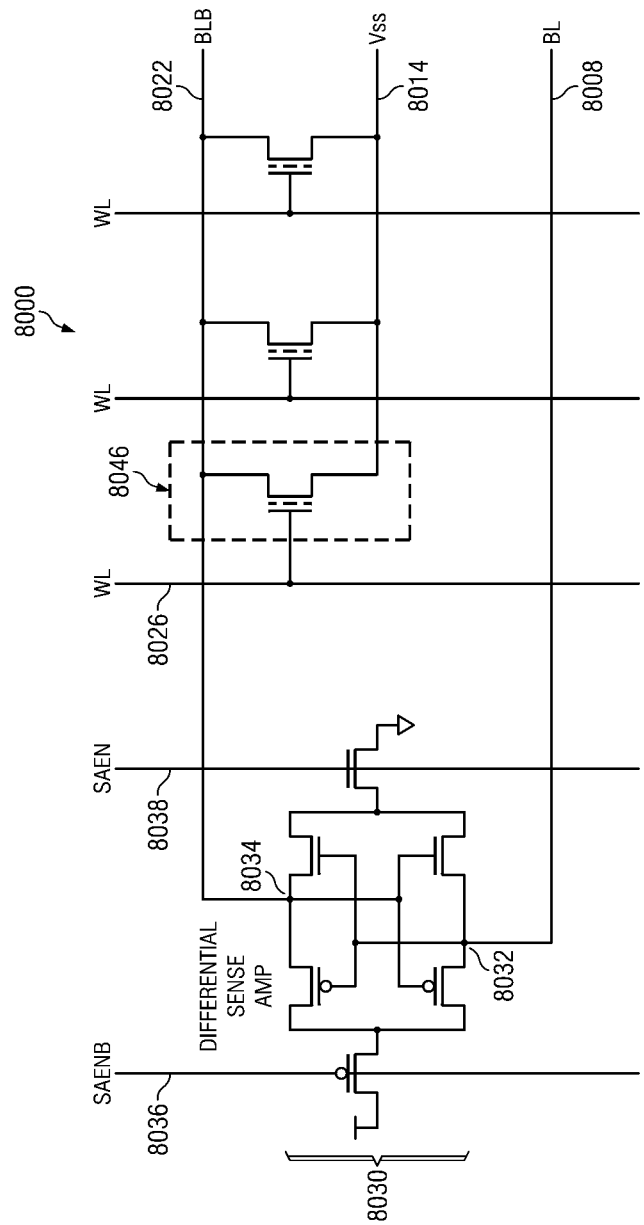
FIG. 8 is an example Flash memory cell sensing scheme.

An example FLASH memory array (8000) with single memory cell sensing is shown in FIG. 8. In this memory array, FLASH cell (8046) connects BLB (8022) to Vss (8014) or ground. At the beginning of a read operation, bitline BLB (8022) is precharged to Vdd and bitline BL (8008) is precharged to approximately ½ Vdd and then they are both floated. When wordline (8026) is selected, if no charge is stored on the floating gate of the FLASH memory cell (e.g. a logic state "0") then the FLASH transistor turns on and BLB (8022) discharges to ground. In this case when the sense amplifier (8030) is enabled with signals sent to sense amplifier enable (8038) and sense amplifier enable bar (8036), the differential voltage developed across the inputs, (8032) and (8034), of the sense amplifier (8030) is approximately ½ Vdd with ground on (8034) and ½ Vdd on (8032). The sense amplifier reads this as a logic state "0". If, however, charge is stored on the floating gate of FLASH cell (8046) and the wordline (8026) is selected, the FLASH transistor does not turn on and BLB (8022) does not discharge but remains near Vdd. In this case the differential voltage developed across the inputs of the sense amplifier (8030) is again approximately ½ Vdd—but in the opposite direction. Now input (8034) is approximately Vdd and input (8032) is ½ Vdd. The sense amplifier reads this as a logic state "1". If there is excessive leakage on BLB (8022) when a logic state "1" is being read, the voltage on BLB (8022) may drop significantly below Vdd. If an insufficient delta voltage is developed across the inputs, (8032) and (8034), of the sense amplifier (8030) then a read error may occur.

Figure 9:
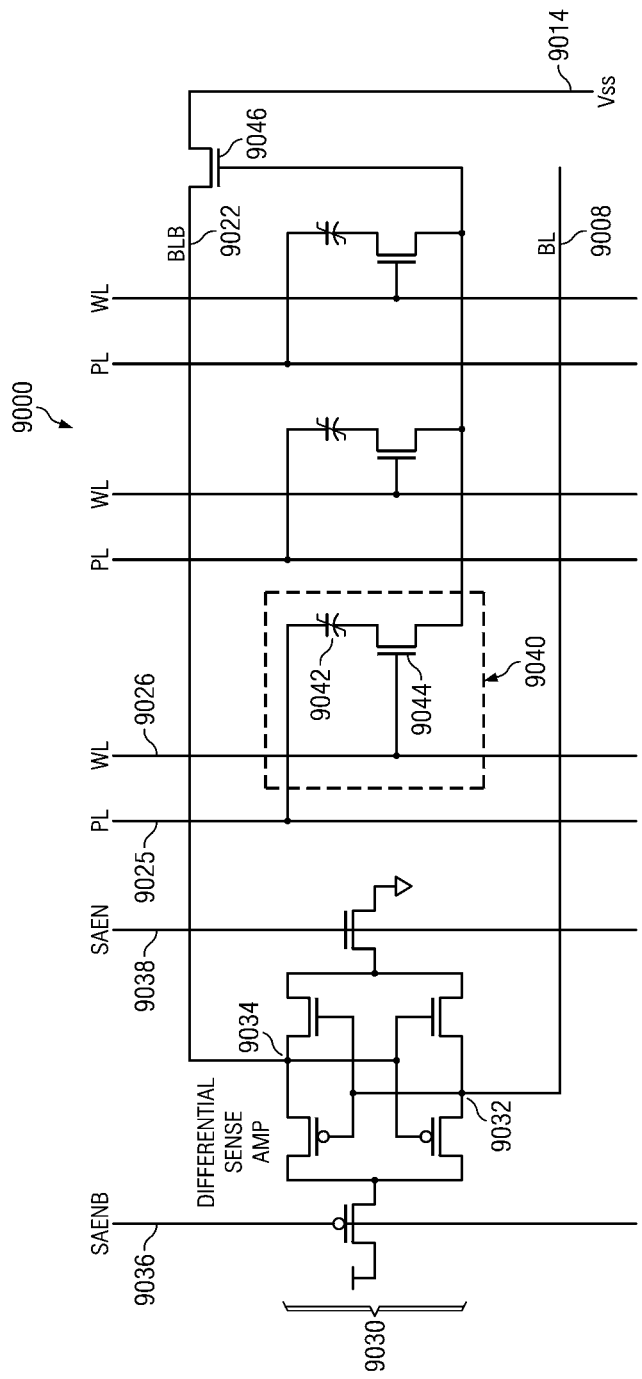
FIG. 9 is an example FRAM memory cell sensing scheme.

An example FRAM memory array (9000) with single memory cell sensing (1T1C) is shown in FIG. 9. In this memory array, FRAM cell (9040) controls the gate of transistor (9046) which connects BLB (9022) to Vss (9014) or ground. At the beginning of a read operation, bitline BLB (9022) is precharged to Vdd and bitline BL (9008) is charged to approximately ½ Vdd, then they are both floated. When plateline (9025) is selected to sense the polarization in the FRAM capacitor (9042), wordline (9026) is selected to turn on FRAM cell transistor (9044) (to connect FRAM cell (9040) to the gate of transistor (9046)), and a "0" polarization is stored on the FRAM capacitor (9042), then transistor (9046) turns on, thereby causing BLB to discharge to ground (9014). In this case, when the sense amplifier (9030) is enabled with signals sent to sense amplifier enable (9038) and sense amplifier enable bar (9036), the differential voltage developed across the inputs, (9032) and (9034), of the sense amplifier (9030) is approximately ½ Vdd (with ground on (9034) and ½ Vdd on (9032)). The sense amplifier (1030) reads this as a logic state "0". If, however, a "1" polarization is stored on the FRAM capacitor (9042), then the transistor (9046) does not turn on and BLB (9022) does not discharge but remains at Vdd. In this case, the differential voltage developed across the inputs of the sense amplifier (9030) is again approximately ½ Vdd but in the opposite direction. Now input (9034) is approximately Vdd and input (9032) is ½ Vdd. The sense amplifier (9030) reads this as a logic state "1". If there is excessive leakage on BLB when a logic state "1" is being read, the voltage on BLB may drop, thereby causing a reduced voltage to appear across the inputs, (9032) and (9034), of the sense amplifier (9030), which may result in a read error. The longer the delay (e.g. 5 ns to 60 ns or more) between when the precharged bitlines are floated and when the wordline is enabled the more charge may leak off the bitline and the more likely it is that a read error may occur.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
    a memory array; and
    an extended delay circuit that, in a testing mode, inserts a write extended delay between when a precharged bitline is floated and when a wordline is enabled during a write operation, and that does not insert the write extended delay during a write operation in normal operation.

2. The integrated circuit of claim 1 wherein said memory array is an SRAM array.

3. The integrated circuit of claim 1 wherein said memory array is an SRAM array and wherein said extended delay circuit also inserts a read extended delay between when a precharged bitline is floated and when a wordline is enabled during a SRAM read operation in the testing mode, and does not insert the read extended delay during a read operation in normal operation.

4. The integrated circuit of claim 1 wherein said write extended delay is in the range of 5 ns to 60 ns.

5. A method of testing an integrated circuit, comprising;
    writing a first data pattern into a memory array;
    reading the memory array to verify the writing of the first data pattern; and
    then performing a first write bitline leakage test on said first data pattern, comprising the steps of:
        writing an inverse of the first data pattern into the memory array, wherein the writing of an inverse is performed using an extended delay circuit to produce a write extended delay between when a precharged bitline is floated and when a wordline is enabled during a each write operation; and
        then reading the memory array to determine whether the read data matches the inverse of the first data pattern.

6. The method of claim 5 wherein said extended delay circuit is on chip.

7. The method of claim 5 wherein said extended delay circuit is off chip.

8. The method of claim 5 wherein said memory array is an SRAM array.

9. The method of claim 5 wherein said memory array is an SRAM array,
    and wherein the reading step uses said extended delay circuit to produces a read extended delay between when a precharged bitline is floated and when a wordline is enabled during each read operation.

10. The method of claim 5 wherein said write extended delay is 5 ns to 60 ns.

11. The method of claim 5 further comprising:
    then writing a second data pattern into said memory array, without using said extended delay circuit to produce the write extended delay, wherein said second data pattern is an inverse of said first data pattern;
    reading the memory array to verify the writing of the second data pattern; and
    then performing a second write bitline leakage test on said second data pattern, comprising the steps of:
        writing an inverse of the second data pattern into the memory array, wherein the writing of an inverse is performed using said extended delay circuit to produce a write extended delay between when a precharged bitline is floated and when a wordline is enabled during each write operation; and
        then reading the memory array to determine whether the read data matches the inverse of the second data pattern.

12. The method of claim 9 wherein an extended delay of 5 ns to 60 ns is generated by said extended delay circuit.

* * * * *